(12) United States Patent
Lee et al.

(10) Patent No.: US 6,258,647 B1
(45) Date of Patent: Jul. 10, 2001

(54) METHOD OF FABRICATING SEMICONDUCTOR DEVICE

(75) Inventors: Chang-Jae Lee; Jong-Kwan Kim, both of Chungcheongbuk-Do (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/041,597

(22) Filed: Mar. 13, 1998

(30) Foreign Application Priority Data

Mar. 13, 1997 (KR) .................................................. 97-8499

(51) Int. Cl.[7] .................. H01L 21/8238; H01L 21/4763; H01L 21/336
(52) U.S. Cl. .......................... 438/233; 438/287; 438/621; 438/643
(58) Field of Search ..................................... 438/231, 438, 438/587, 283, 195, 199, 201, 700, 233, 287, 621, 643, 586, 764; 257/377

(56) References Cited

U.S. PATENT DOCUMENTS

| | | | |
|---|---|---|---|
| 5,355,101 | * 10/1994 | Fujii et al. | 257/377 |
| 5,382,532 | * 1/1995 | Kobayashi et al. | 438/587 |
| 5,468,669 | 11/1995 | Lee et al. | |
| 5,550,079 | * 8/1996 | Lin | 438/587 |
| 5,759,886 | * 6/1998 | Chung | 438/231 |

\* cited by examiner

Primary Examiner—Long Pham
Assistant Examiner—William David Coleman

(57) ABSTRACT

A method of fabricating a semiconductor device includes the steps of: forming a well of first conductivity type and well of second conductivity type in a substrate; forming a field oxide layer and gate oxide layer on the substrate; forming first and second polysilicon layers on the field oxide layer and gate oxide layer, the first polysilicon layer being doped with impurities of second conductivity type, the second polysilicon layer being doped with impurities of first conductivity, the first and second polysilicon layers coming into contact with each other; patterning the first and second polysilicon layers to be isolated from each other, to thereby forming first and second gates; and forming a conductive layer between the first and second gates. Accordingly, isolation of N-type and P-type polysilicon layers from each other, and patterning of them for the purpose of forming a gate are carried out using one mask, effectively simplifying the etching process during a gate patterning process. Also, by providing a conductive layer between the first and second gates, which electrically connects those gates, mutual diffusion of the impurities doping the polysilicon layers is prevented.

14 Claims, 5 Drawing Sheets

METHOD OF FABRICATING SEMICONDUCTOR DEVICE

BACKGROUND OF THE INVENTION

1. Field of the Invention

Figure 1A:
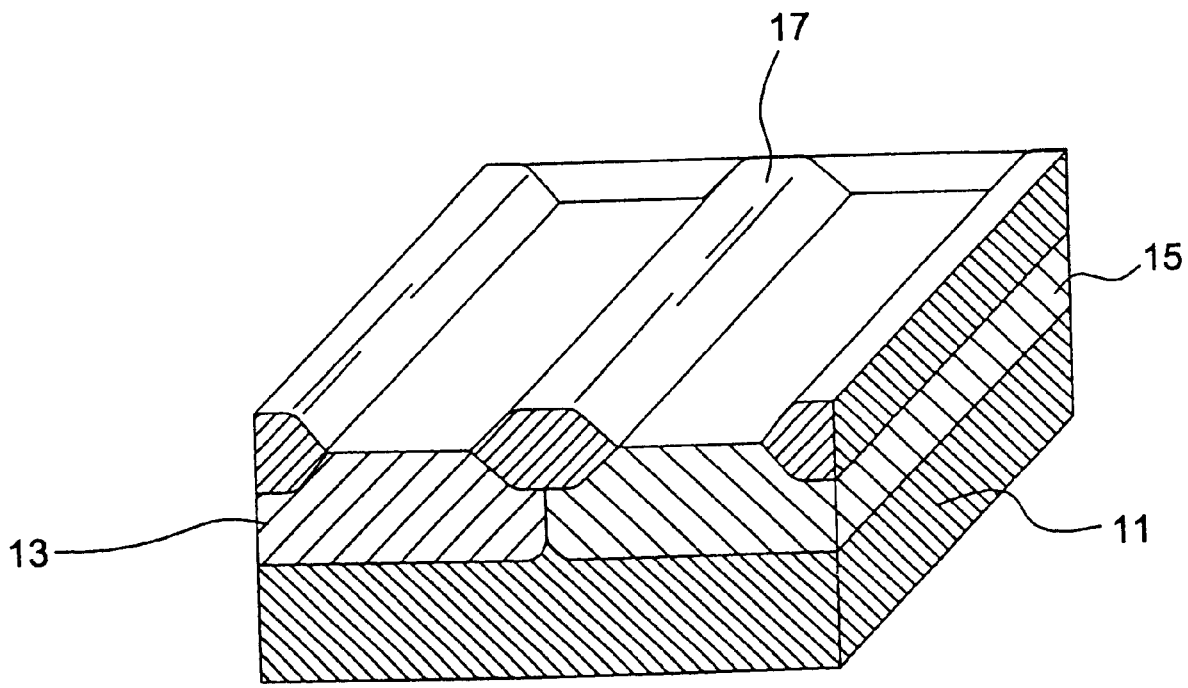

The present invention relates to a method of fabricating a semiconductor device, and more specifically, to a method of fabricating a semiconductor device having a dual gate.

2. Discussion of Related Art

The line pitch of semiconductor integrated circuits has been scaled down to a submicron level in order to improve operation characteristics and integration. This size reduction effectively reduces the space between adjacent gate lines used to form the semiconductor integrated circuit in a MOS transistor. Accordingly, a parasitic capacitance between the gate lines is increased, resulting in deterioration of the integrated circuit's signal transmission rate. The signal transmission rate depends on delay time which is determined by the resistance (R) of the gate line, and parasitic capacitance (C) between the gate lines.

For the purpose of increasing the signal transmission rate, the resistance in the gate line must be reduced or the parasitic capacitance must be decreased, e.g., by widening the space between the gate lines. Because extending the space between the gate lines has negative effects on circuit integration, a reduction of the resistance is preferred. For this reason, the gate has been conventionally formed of a polycide which results from depositing a silicide on a highly doped polysilicon layer.

As a CMOS transistor is highly integrated, the size of its NMOS and PMOS transistors is reduced, and their characteristics are deteriorated due to short channel effect and hot carrier effect. To solve this problem, the NMOS and PMOS transistors have been formed with a lightly doped drain (LDD) structure, and N-type impurities are highly doped into the gate of the NMOS and PMOS transistors. Thus, the channel of the PMOS transistor is formed in the bulk, not on the substrate. This produces punchthrough, decreasing the breakdown voltage.

Alternatively, a dual-gate CMOS transistor is proposed, in which the PMOS transistor has a highly doped P$^+$-type gate, and the NOS transistor has a highly doped N$^+$-type gate. With this structure, the channel of the PMOS transistor is formed on the surface of the substrate. Thus the breakdown voltage caused by the punchthrough is prevented from being decreased. The gate of the dual-gate CMOS transistor is also formed of the polycide consisting of a highly doped polysilicon and silicide. This prevents the signal transmission rate from being deteriorated in response to increased circuit integration.

However, in this structure, the impurity that is highly doped into the polysilicon is diffused into the silicide during high temperature process.

Furthermore, since impurity's diffusitivity in the silicide is higher than that in the polysilicon, the diffused impurity is laterally diffused in the silicide. Accordingly, the N-type and P-type impurities of the N$^+$ polysilicon and P$^+$ polysilicon are mutually diffused through the silicide, changing the threshold voltage of the MOS transistor. A technique for preventing the change of the threshold voltage is disclosed in U.S. Pat. No. 5,468,669, "Integrated circuit fabrication", by Kuo-Hua Lee et. al.

FIGS. 1A to 1E show a conventional process of fabricating a semiconductor device. Referring to FIG. 1A, P-type and N-type impurities are sequentially doped into a substrate 11, to form a P-well 13 and N-well 15. A field oxide layer 17, for electrically isolating single elements from each other, is formed where P-well 13 and N-well 15 come into contact with each other, through a local oxidation of silicon (LOCOS) process.

Figure 1B:
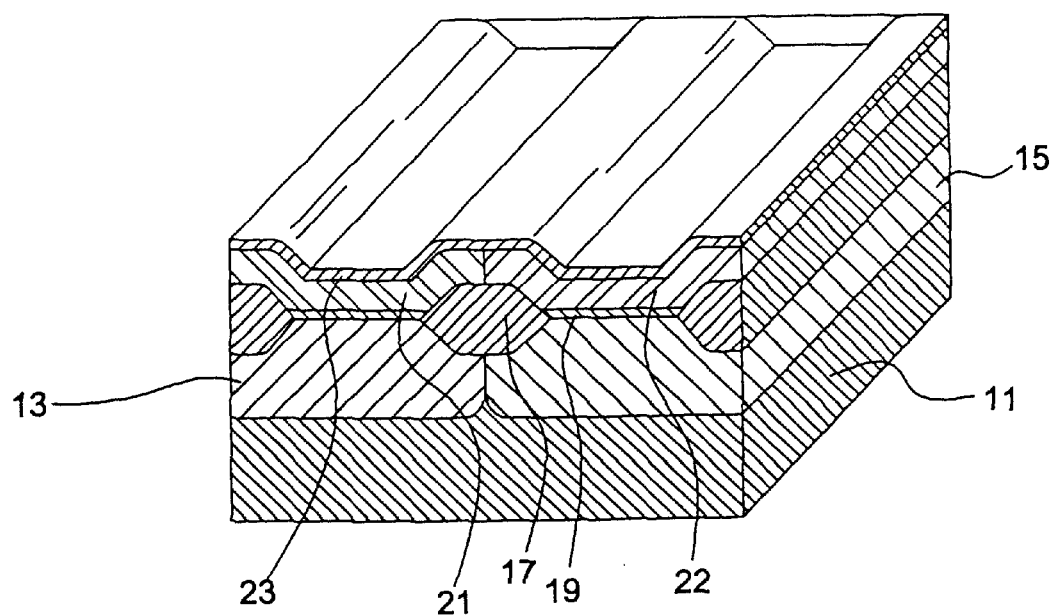

Referring to FIG. 1B, thermal oxidation is performed on the surface of P-well 13 and N-well 15, forming a gate oxide layer 19. Undoped polysilicon or amorphous silicon is deposited on field oxide layer 17 and gate oxide layer 19 through chemical vapor deposition (CVD), to form a silicon layer. N-type impurities such as As or P are ion-implanted in higher concentration into a portion of the silicon layer, corresponding to P-well 13 to form a N-type polysilicon layer 21, and P-type impurities like B or BF$_2$ are ion-implanted in higher concentration into a portion of the silicon layer corresponding to N-well 15 to form a P-type polysilicon layer 22. A refractory metal silicide layer 23, such as tungsten silicide (WSix), is formed on N-type and P-type polysilicon layers 21 and 22 using CVD.

Figure 1C:
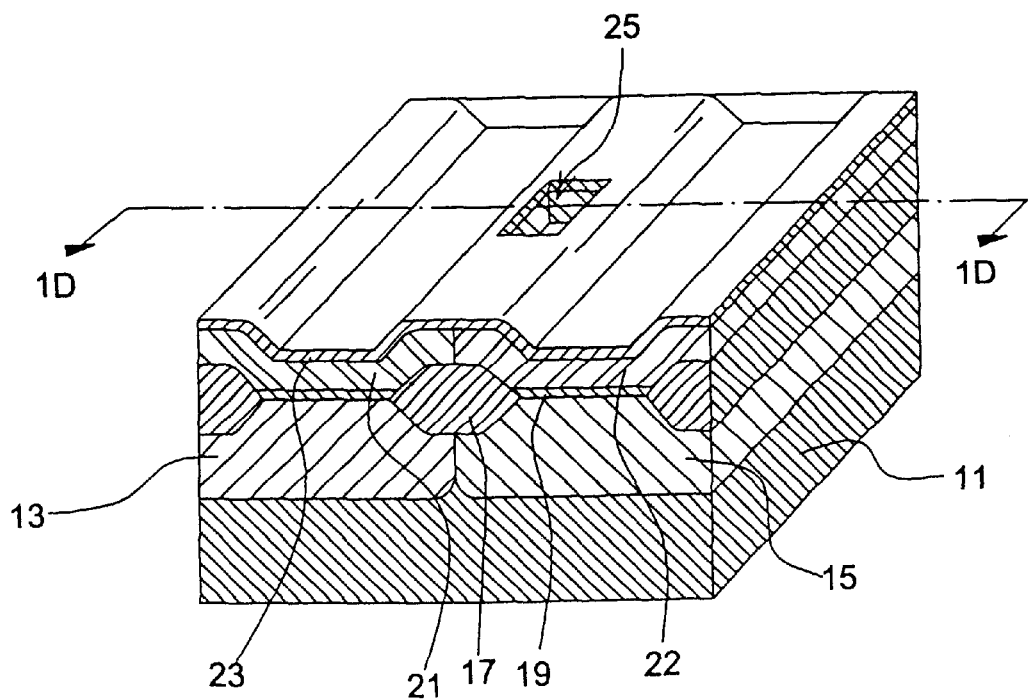
Figure 1D:
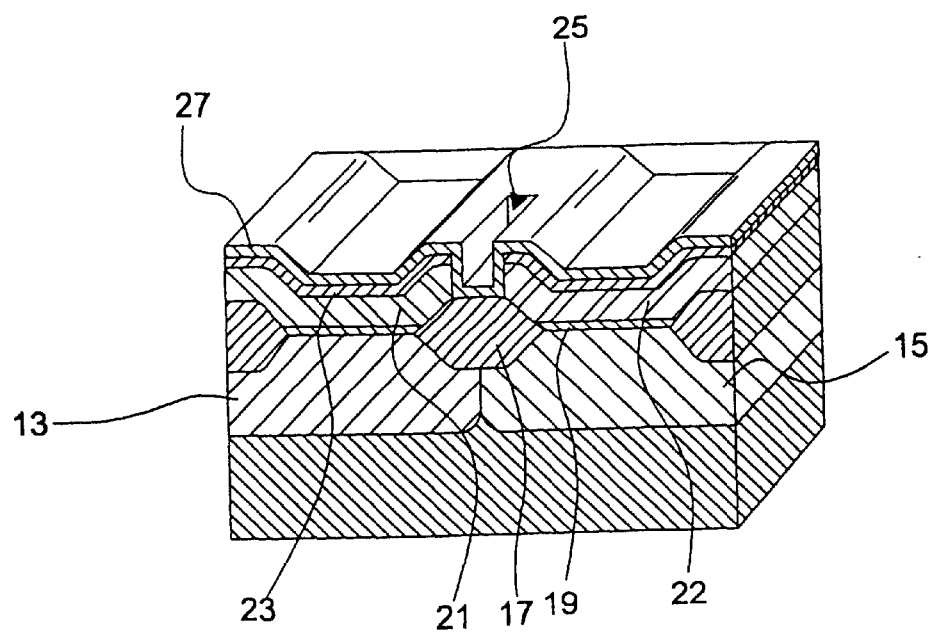

Referring to FIG. 1C, silicide layer 23, and N-type and P-type polysilicon layers 21 and 22 are sequentially patterned through photolithography, to form a contact hole 25 exposing field oxide layer 17. Contact hole 25 is formed at a position where N-type and P-type polysilicon layers 21 and 22 come into contact with each other. Referring to FIG. 1D, TiN is deposited on silicide layer 23 through CVD, to form a diffusion stop layer 27. FIG. 1D shows a cross-section taken along line 1D—1D of FIG. 1C. As shown in the cross-section, a contact hole 25 is also formed in diffusion stop layer 27 above field oxide layer 17.

Figure 1E:
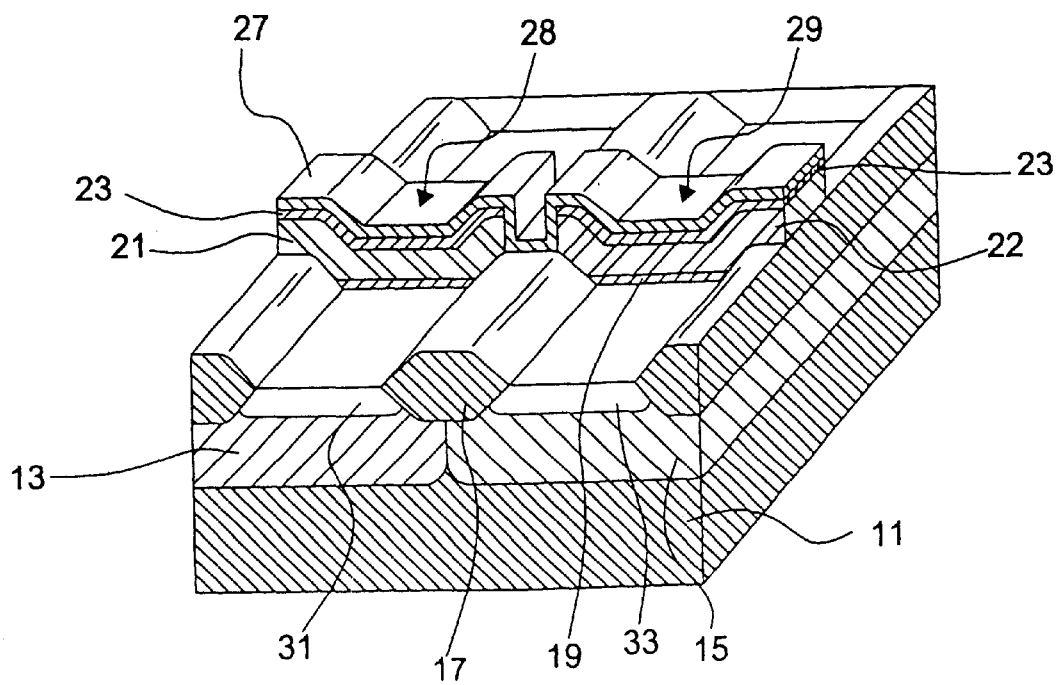

Referring to FIG. 1E, diffusion stop layer 27, silicide layer 23, N-type and P-type polysilicon layers 21 and 22, and gate oxide layer 19 are patterned, through photolithography, to expose portions of wells 13 and 15, and field oxide layer 17. N-type and P-type polysilicon layers 21 and 22 do not come into contact with each other, but they are electrically connected through diffusion stop layer 27. That is, N-type and P-type polysilicon layers 21 and 22 are separated from each other, and diffusion stop layer 27 is formed therebetween using a mask aligned to contact hole 25 during the photo-lithography process. Thus, the impurities doped into the polysilicon layers 21 and 22 are prevented from being mutually diffused.

N-type and P-type polysilicon layers 21 and 22, together with diffusion stop layer 27 and silicide layer 23 formed thereon, become gates 28 and 29 of NMOS and PMOS transistors. N-type impurities such as As or P, and P-type impurities like B or BF$_2$ are respectively ion-implanted in higher concentration into P-well 13 and N-well 15, to thereby form impurities regions 31 and 33. Since the N-type and P-type polysilicon layers 21 and 22 are separated from each other and the diffusion stop layer 27 is formed therebetween, the polysilicon layers 21 and 22 are electrically connected, but the impurities doped thereinto are not mutually diffused. Accordingly, it is possible to prevent the threshold voltage from being changed.

However, the above-described conventional method requires a first mask for isolating the N-type and P-type polysilicon layers from each other (FIG. 1D), and a second mask for patterning them in order to form the gate (FIG. 1E). Thus, it is difficult to align the gate patterning mask and the contact hole. Furthermore, the diffusion stop layer as well as the polysilicon layers should be etched when the gate is patterned. This complicates the process.

SUMMARY OF THE INVENTION

Accordingly, the present invention is directed to a method of fabricating a semiconductor device that substantially obviates one or more of the problems due to limitations and disadvantages of the related art.

An object of the present invention is to provide a method of fabricating a semiconductor device, which performs isolation of N-type and P-type polysilicon layers from each other and patterns them for the purpose of forming a gate, using one mask.

Another object of the present invention is to provide a method of fabricating a semiconductor device, which simplifies etching process during a gate patterning process, to thereby reduce the number of process step.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a semiconductor device including the steps of forming a well of a first conductivity type and a well of a second conductivity type in a substrate, forming a field oxide layer and a gate oxide layer on the substrate, forming first and second polysilicon layers to contact one another on the field oxide layer and the gate oxide layer, and isolating the first and second polysilicon layers and forming first and second gates.

At least a portion of the first polysilicon layer is doped with impurities of a second conductivity type, and at least a portion of the second polysilicon layer is doped with impurities of a first conductivity type. The portion of the first polysilicon layer that is doped with impurities of the second conductivity type corresponds to a first well having first conductivity type, and the portion of the second polysilicon layer that is doped with impurities of the first conductivity type corresponds to a second well having second conductivity type. The first and second polysilicon layers may be formed by depositing a formative layer on the field oxide layer and the gate oxide layer, doping a portion of the formative layer corresponding to the first well with impurities of second conductivity type, and doping a portion of the formative layer corresponding to the second well with impurities of first conductivity type. The formative layer includes at least one of an undoped polysilicon and an amorphous silicon. The method may also include the steps of forming a first impurity region by doping impurities of second conductivity type into the first well, and forming a second impurity region by doping impurities of first conductivity type into the second well.

Additional steps used to form the semiconductor device may include forming a conductive layer between the first and second gates by depositing a conductive material on the field oxide layer and the gate oxide layer, and on and between the first and second gates, and then etching the conductive material to form the conductive layer between the first and second gates. The conductive layer is formed of a material having conduction and diffusion stop characteristics. A silicide layer may also be formed on the first and second polysilicon layers, the silicide layer being formed of a refractory metal silicide selected from W, Co, Ti, Ta, Mo, Pt or Ni.

The present invention also includes a semiconductor device produced from the above methods, and a semiconductor device including a substrate, doped impurity regions positioned on the substrate and functioning as source and drain regions, a gate oxide layer and a field oxide layer positioned on the substrate, first and second gates positioned on the gate oxide layer, and a conductive layer positioned between the first and second gates.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and which are incorporated in and constitute a part of this specification, illustrate embodiments of the invention and together with the description serve to explain the principles of the invention. In the drawings:

FIGS. 1A to 1E show a conventional method of fabricating a semiconductor device; and FIGS. 2A to 2D show a method of fabricating a semiconductor device according to an embodiment of the present invention.

DETAILED DESCRIPTION OF PREFERRED EMBODIMENT

Reference will now be made in detail to the preferred embodiments of the present invention, examples of which are illustrated in the accompanying drawings.

Figure 2A:
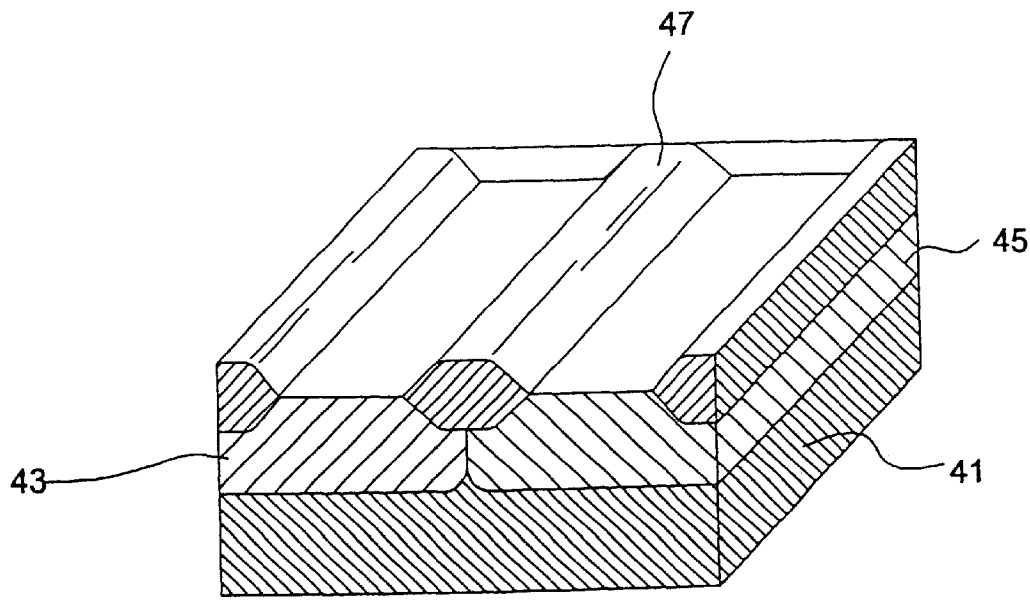

FIGS. 2A to 2D show a method of fabricating a semiconductor device according to the present invention. Referring to FIG. 2A, a P-well 43 and N-well 45 are formed in a substrate 41, through a well-known conventional method. Substrate 41 may be formed of a silicon into which P-type or N-type impurities are doped, or an epitaxial silicon. A field oxide layer 47, for electrically isolating single elements from each other, is formed through LOCOS at a position where P-well 43 and N-well 45 come into contact with each other.

Figure 2B:
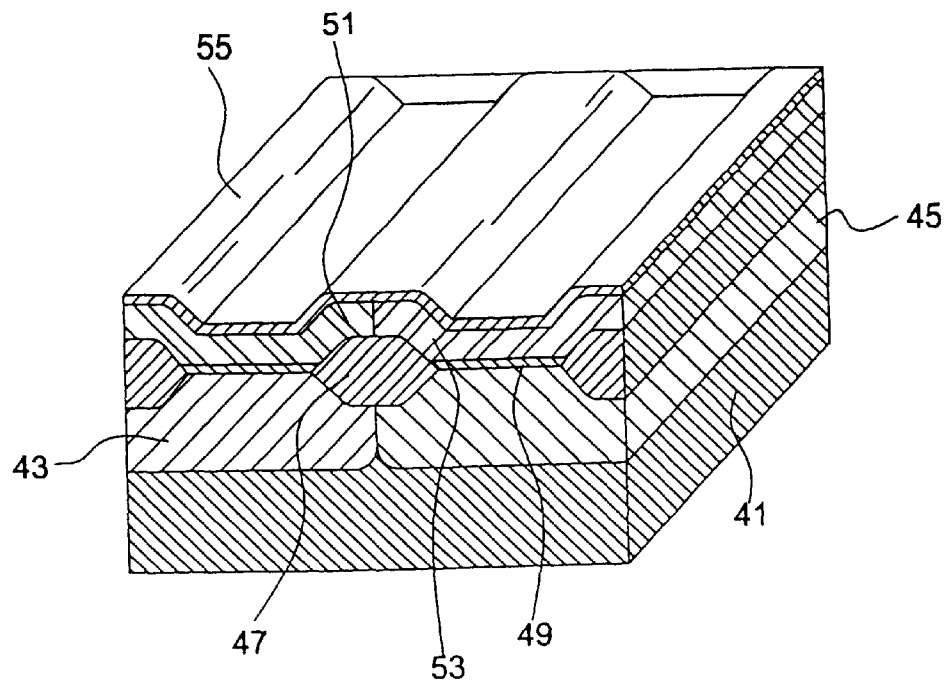

Referring to FIG. 2B, the surface of P-well 43 and N-well 45 is thermally oxidized to a depth of 50 to 100 A, to form a gate oxide layer 49. An undoped polysilicon or amorphous silicon is deposited by a thickness of 1500 to 2500 A on field oxide layer 47 and gate oxide layer 49 using CVD, forming a silicon layer. N-type impurities such as As or P, and P-type impurities like B or $BF_2$ are respectively ion-implanted in higher concentrations into portions of the silicon layer, respectively corresponding to P-well 43 and N-well 45, to define N-type and P-type polysilicon layers 51 and 53.

When N-type polysilicon layer 51 is defined, As is implanted into the silicon layer at a concentration of $5 \times 10^{15}$ to $5 \times 10^{16}/cm^2$ with energy of 100 to 300 KeV, or P is implanted at the same concentration with energy of 30 to 60 KeV. When P-type polysilicon layer 53 is defined, B is implanted into the silicon layer at a concentration of $5 \times 10^{15}$ to $5 \times 10^{16}/cm^2$ with energy of 20 to 40 KeV, or $BF_2$ is implanted at the same with energy of 60 to 160 KeV.

Moreover, during the ion implantation, the portion corresponding to N-well 45 is covered with a photoresist (not shown) when N-type polysilicon layer 51 is defined, and the portion corresponding to P-well 43 is covered with a photoresist (not shown) when P-type polysilicon layer 53 is defined. Thereafter, a refractory metal silicide 55, such as W, Co, Ti, Ta, Mo, Pt and Ni, is deposited through CVD at a thickness of 500 to 1000 A on N-type and P-type polysilicon layers 51 and 53.

Figure 2C:
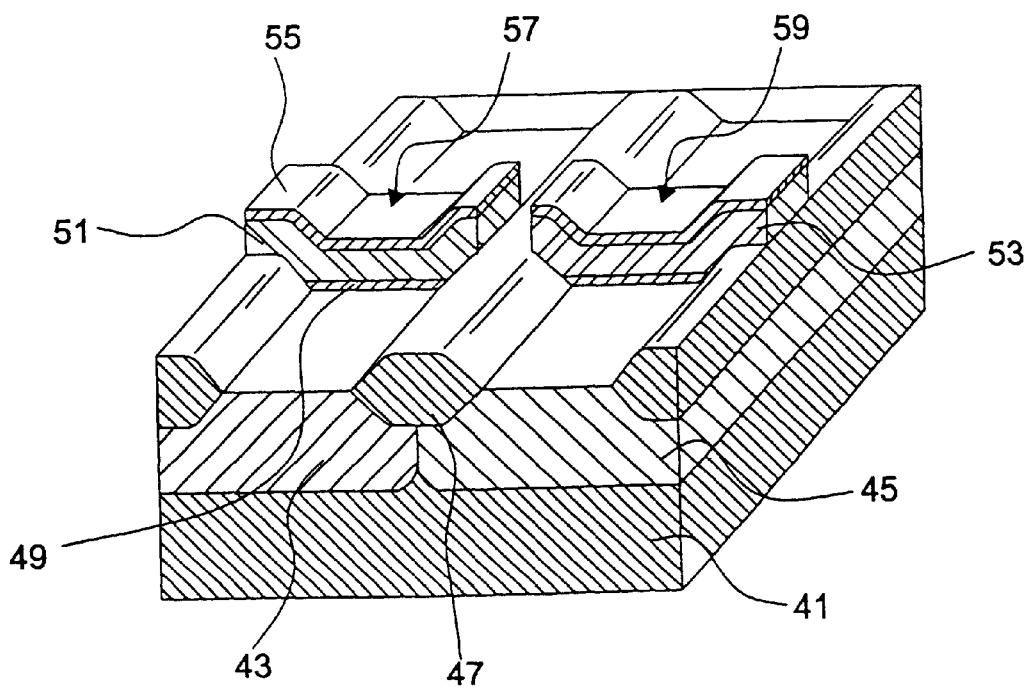

Referring to FIG. 2C, a predetermined portion of silicide layer 55 and N-type and P-type polysilicon layers 51 and 53 are sequentially patterned through photolithography, forming gates 57 and 59 of NMOS and PMOS transistors. Here, gate oxide layer 49 is removed to expose P-well 43 and N-well 45. Then, the contact portion of N-type and P-type polysilicon layers 51 and 53, placed on field oxide layer 47, and a portion of silicide layer 55 placed thereon are removed to isolate gates 57 and 59 from each other. More specifically, after the structure of FIG. 2B is formed, a photoresist (not shown) is formed on the overall surface of that structure. A portion of the photoresist is removed, leaving the portion corresponding to gates 57 and 59. Then, layers 49, 53 and 55 are removed using the remaining portion of the photoresist as a mask.

Figure 2D:
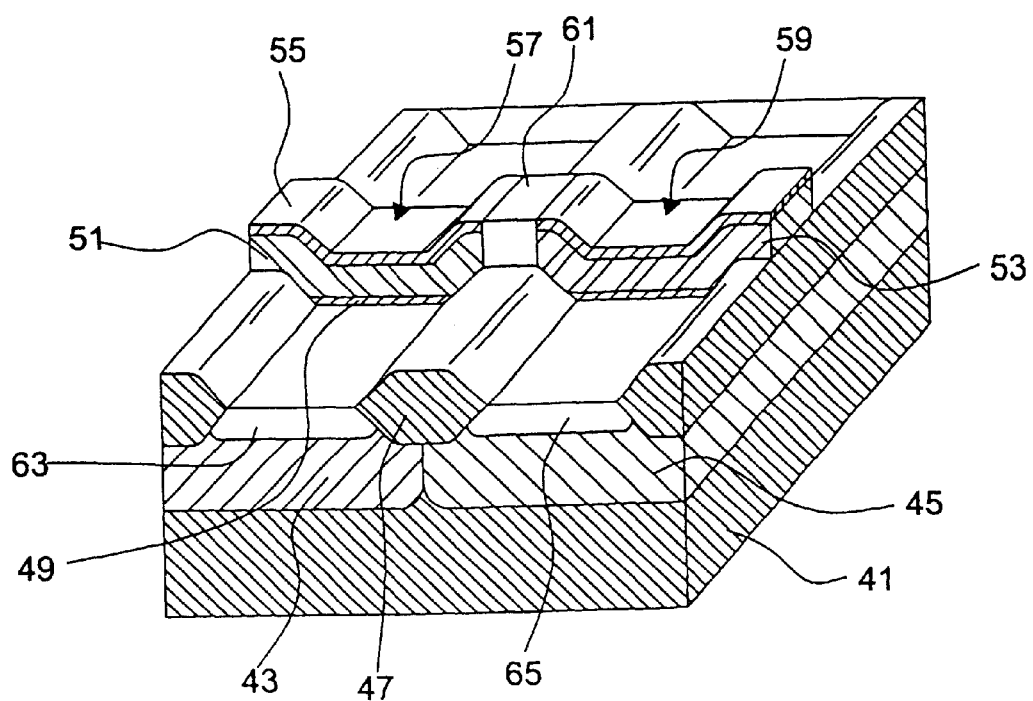

Referring to FIG. 2D, a material having conduction and diffusion stop characteristics, such as TiN, TaN and WN, is deposited by a thickness of 1000 to 1500 A on the overall surface of the substrate, using CVD, thereby forming a conductive layer 61. Here, conductive layer 61 is filled in the portion where gates 57 and 59 are separated from each other. Thereafter, conductive layer 61 is etched back to expose silicide layer 55, and wells 43 and 45. Conductive layer 61 is left between gates 57 and 59. By doing so, conductive layer 61 electrically connects gates 57 and 59 to each other, and prevents the impurities, doped into N-type and P-type polysilicon layers 51 and 53, from being mutually diffused. An N-type impurity region 63 and P-type impurity region 65 are respectively formed in P-well 43 and N-well 45, through a conventional method. N-type and P-type impurity regions 63 and 65 serve as a source and drain of the NMOS and PMOS transistors.

As described above, in the method of fabricating a semiconductor device according to the present invention, the silicide layer, N-type and P-type polysilicon layers are patterned using one mask, to isolate the two polysilicon layers from each other, and at the same time to, form the gates from the polysilicon layers. Furthermore, the conductive layer is formed to fill the portion between the gates, and etched back to expose the silicide layer and wells, to form the diffusion stop layer.

Accordingly, the present invention reduces the number of process step because the isolation of N-type and P-type polysilicon layers, and patterning of gate are performed using one mask. Moreover, only silicide layer and polysilicon layers are etched when the gate is patterned, simplifying the etching process.

It will be apparent to those skilled in the art that various modifications and variations can be made in the method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising the steps of:

forming a well of a first conductivity type and a well of a second conductivity type in a substrate;

forming a field oxide layer and a gate oxide layer on the substrate;

forming first and second polysilicon layers on the field oxide layer and the gate oxide layer, at least a portion of the first polysilicon layer being doped with impurities of a second conductivity type, at least a portion of the second polysilicon layer being doped with impurities of a first conductivity type, the first and second polysilicon layers contacting each other;

isolating the first and second polysilicon layers and forming first and second gates;

depositing a conductive material on the field oxide layer and the gate oxide layer, and on and between the first and second gates; and etching the conductive material to form the conductive layer between the first and second gates.

2. The method recited by claim 1, wherein the conductive layer is formed of a material having conduction and diffusion stop characteristics.

3. The method recited by claim 1, wherein the portion of the first polysilicon layer that is doped with impurities of the second conductivity type corresponds to a first well having first conductivity type, and the portion of the second polysilicon layer that is doped with impurities of the first conductivity type corresponds to a second well having second conductivity type.

4. The method recited by claim 3, wherein the step of forming the first and second polysilicon layers comprises:

depositing a formative layer on the field oxide layer and the gate oxide layer, the formative layer including at least one of an undoped polysilicon and an amorphous silicon;

doping a portion of the formative layer corresponding to the first well with impurities of second conductivity type; and doping a portion of the formative layer corresponding to the second well with impurities of first conductivity type.

5. The method recited by claim 3, further comprising:

forming a first impurity region by doping impurities of second conductivity type into the first well, and forming a second impurity region by doping impurities of first conductivity type into the second well.

6. The method recited by claim 1, further comprising:

forming a silicide layer on the first and second polysilicon layers.

7. The method recited by claim 6, wherein the silicide layer is formed of a refractory metal silicide selected from W, Co, Ti, Ta, Mo, Pt or Ni.

8. The method recited in claim 1, wherein said step of isolating comprises simultaneously isolating the first and second polysilicon layers and forming first and second gates.

9. A method of fabricating a semiconductor device, comprising the steps of:

forming a well of a first conductivity type and a well of a second conductivity type in a substrate;

forming a field oxide layer and a gate oxide layer on the substrate;

forming first and second polysilicon layers on the field oxide layer and the gate oxide layer, at least a portion of the first polysilicon layer being doped with impurities of a second conductivity type, at least a portion of the second polysilicon layer being doped with impurities of a first conductivity type, the first and second polysilicon layers contacting each other;

forming a metal silicide layer on the first and second polysilicon layers;

selectively etching the metal silicide layer, the first and second polysilicon layers and the gate oxide to simultaneously isolate the first and second polysilicon layers and form first and second gates;

depositing a conductive material on the field oxide layer and the gate oxide layer, and on and between the first and second gates; and etching the conductive material to form the conductive layer between the first and second gates.

10. The method of fabricating a semiconductor device of claim 9, wherein the conductive layer is formed of a material having conduction and diffusion stop characteristics.

11. The method of fabricating a semiconductor device of claim 9, wherein the portion of the first polysilicon layer that is doped with impurities of the second conductivity type corresponds to a first well having first conductivity type, and the portion of the second polysilicon layer that is doped with impurities of the first conductivity type corresponds to a second well having second conductivity type.

12. The method of fabricating a semiconductor device of claim 11, wherein the step of forming the first and second polysilicon layers comprises:

depositing a formative layer on the field oxide layer and the gate oxide layer, the formative layer including at least one of an undoped polysilicon and an amorphous silicon;

doping a portion of the formative layer corresponding to the first well with impurities of second conductivity type; and doping a portion of the formative layer corresponding to the second well with impurities of first conductivity type.

13. The method of fabricating a semiconductor device of claim 11, further comprising:

forming a first impurity region by doping impurities of second conductivity type into the first well; and forming a second impurity region by doping impurities of first conductivity type into the second well.

14. The method of fabricating a semiconductor device of claim 9, wherein the metal silicide layer is formed of a refractory metal silicide selected from W, Co, Ti, Ta, Mo, Pt or Ni.

* * * * *